(12) United States Patent
Shiono et al.

(10) Patent No.: US 6,425,294 B1
(45) Date of Patent: Jul. 30, 2002

(54) PRESSURE SENSOR UNIT

(75) Inventors: Mikio Shiono; Kenichi Fukuda, both of Gunma-Ken (JP)

(73) Assignee: Shin-Etsu Chemical Co., Ltd, Toyko (JP)

( * ) Notice: Subject to any disclaimer, the term of this patent is extended or adjusted under 35 U.S.C. 154(b) by 0 days.

(21) Appl. No.: 09/574,259

(22) Filed: May 19, 2000

(30) Foreign Application Priority Data

Oct. 4, 1999 (JP) ............................................ 11-282430

(51) Int. Cl.$^7$ ............................ G01L 7/00; G01L 19/14; H01R 9/00

(52) U.S. Cl. ............................ 73/756; 73/1.57; 73/431; 73/706; 73/715; 73/753; 73/754; 361/823; 361/824; 428/421; 428/422; 428/413; 428/447; 528/15; 528/25; 528/31

(58) Field of Search .......................... 73/753, 754, 756, 73/706, 715, 1.57, 431; 361/823, 824; 428/421, 422, 413, 447; 528/15, 25, 31

(56) References Cited

U.S. PATENT DOCUMENTS

| | | | | |
|---|---|---|---|---|
| 5,266,827 A | * | 11/1993 | Kato ........................... 257/417 |
| 5,656,711 A | * | 8/1997 | Fukuda et al. ................. 528/15 |
| 5,747,694 A | * | 5/1998 | Baba et al. .................... 73/723 |
| 6,034,421 A | * | 3/2000 | Tokunga ..................... 257/666 |
| 6,040,400 A | * | 3/2000 | Fukuda et al. ............... 526/126 |
| 6,121,359 A | * | 9/2000 | Fujiki et al. ................. 524/440 |
| 6,127,504 A | * | 10/2000 | Fukuda et al. ................. 528/15 |

OTHER PUBLICATIONS

Japanese Abstract, Pub. #01189539, Pub. Date Jul. 28, 1999, Terumi.
Japanese Abstract, Pub. #63008523, Pub. Date Jan. 14, 1988, Norio.
Japanese Abstract, Pub. #62228926, Pub. Date Oct. 7, 1987, Terumi.
Japanese Abstract, Pub. #11116685, Pub. Date Apr. 27, 1999, Yasuro.

* cited by examiner

*Primary Examiner*—Robert Dawson
*Assistant Examiner*—Jeffrey B. Robertson
(74) *Attorney, Agent, or Firm*—Millen, White, Zelano & Branigan, P.C.

(57) ABSTRACT

A pressure sensor unit which comprises (i) a housing, (ii) pressure sensor members installed therein including a mount, the bottom of which is fixed to the inner base of the housing by means of an adhesive, a sensor chip firmly bonded to the top of the mount, terminals disposed on the inner base of the housing and bonding wires connecting the sensor chip to their respective terminals, and (iii) a sealant filling the housing so that all the pressure sensor members are completely buried therein; with the terminals being covered with a fluorinated polymer-containing composition functioning as adhesive in at least an upper part thereof and with the sealant being a fluorinated polymer-containing gel material, wherein the composition as adhesive is similar in fluorinated polymer to the gel material.

5 Claims, 1 Drawing Sheet

Fig.1 Pressure Sensor Unit
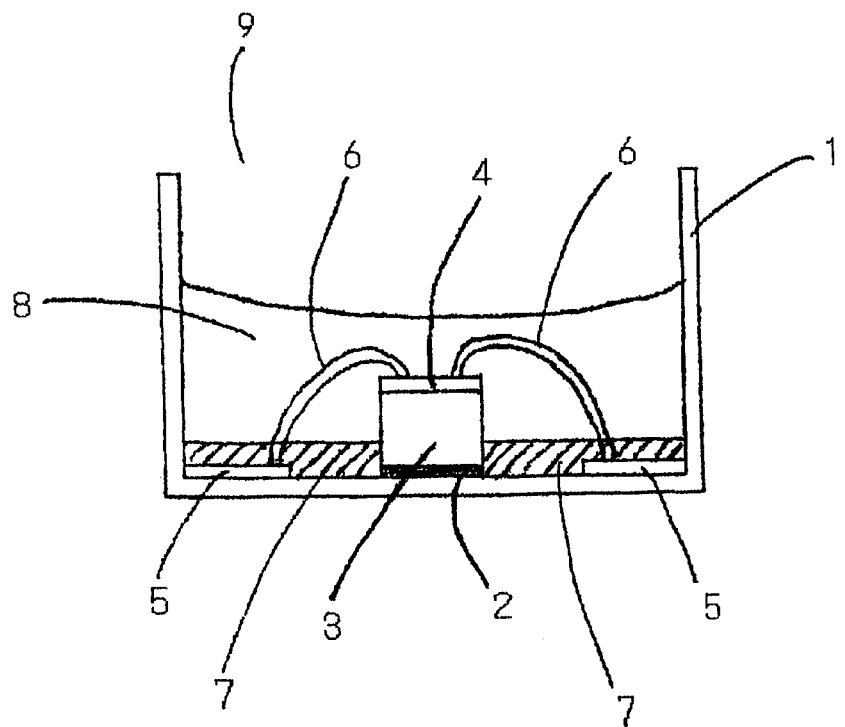

PRESSURE SENSOR UNIT

FIELD OF THE INVENTION

The present invention relates to a pressure sensor unit and, more particularly, to a pressure sensor unit that is encapsulated in a fluorinated polymer-containing material for protection to acquire an extended endurance span.

BACKGROUND OF THE INVENTION

For the purpose of protecting a semiconductor device, such as a pressure sensor, against electric, mechanical or/and chemical impacts from outside, it has so far been known to install the semiconductor device in a housing and fill the vacant part of the housing with a gel material having excellent characteristics, including high electric insulation and strong resistances to thermal impact, vibration and both high and low temperatures. The gel materials prevailingly used for sealing up the housing are silicone resins, but the silicone resin gel has drawbacks of swelling in solvents, such as toluene, gasoline and gasohol, having high moisture permeability in spite of good water resistance and being subject to deterioration from chemicals, such as a strong acid and a strong alkali.

In the field of requiring gasoline resistance, water resistance and chemical resistance in addition to the aforementioned characteristics, it is therefore indispensable to use a fluorinated polymer-containing gel material having all the required characteristics. For instance, the pressure sensor unit used for pressure detection of fuel gas or exhaust gas of the engine in a car undergoes not only changes in pressure and temperature but also exposure to gasoline vapor, water vapor and acidic exhaust gases, so that the gel materials of fluorinated polymer-containing type are used as a suitable encapsulant for protecting the unit from the foregoing external impacts (Tokkai Hei 11-116685, and the term "Tokkai" as used herein means an "unexamined published Japanese patent application).

As an example of the material forming such a fluorinated polymer-containing gel encapsulant, the curable perfluoropolyether resin composition has so far been proposed which is constituted basically of (A) straight-chain fluoropolyether compounds containing an alkenyl group in each molecule and having a perfluoropolyether structure in each main chain, (B) fluorine-containing organic silicone compounds containing in each molecule hydrogen atoms bonded to silicon atoms and (C) a platinum group compound.

However, when the pressure sensor unit is encapsulated in only the gelled perfluoropolyether resin composition as mentioned above and put in an environment that the unit undergoes repeated changes in temperature and pressure in the atmosphere of the aforementioned gases, the gas bubbles are produced in the gel, and the produced bubbles grow or move to generate cracks in the gel or cut the bonding wires. As a result, there occurs a problem that not only the protective function of the gel but also the sensory function of the unit itself is lost.

SUMMARY OF THE INVENTION

As a result of our intensive studies to solve the aforementioned problem, it has been found that the endurance span of a pressure senor unit can be lengthened by covering at least the upper part of terminals with a film of fluorinated polymer-containing adhesive prior to encapsulation in a gel hitherto employed for pressure senor units, thereby achieving the present invention.

Therefore, an object of the present invention is to provide a pressure sensor unit having sufficient durability even when the pressure sensor unit is used in an environment that it undergoes- changes in temperature and pressure, and besides, it is exposed to the atmosphere of gasoline vapor, water vapor and acidic exhaust gases.

The aforementioned object of the invention is attained with a pressure sensor unit comprising (i) a housing, (ii) pressure sensor members installed therein which include a mount, the bottom of which is fixed to the inner base of the housing by means of an adhesive, a sensor chip firmly bonded to the top of the mount, terminals disposed on the inner base of the housing and bonding wires connecting the sensor chip to their respective terminals, and (iii) a encapsulant filling the housing so that all the pressure sensor members are completely buried therein; with the terminals being covered with a film of fluorinated polymer-containing adhesive composition in at least an upper part thereof, and the encapsulant being a fluorinated polymer-containing gel material, wherein the composition as adhesive is similar in fluorinated polymer to the gel material.

In the present pressure sensor unit, the terminals are covered with a film of fluorinated polymer-containing adhesive composition in their respective upper parts, and further entirely buried under the gel encapsulant. Therefore, they are hard to undergo the influences of gasoline vapor, water vapor and acidic exhaust gases even when the unit is exposed to the atmosphere containing those vapors and gases. Further, even when the unit is put under a condition to suffer changes in pressure and temperature, the encapsulant is effectively prevented from producing gas bubbles and generating cracks; as a result, the pressure sensor buried in the encapsulant can have a substantial improvement in endurance span. Accordingly, the present unit is useful as a pressure sensor unit loaded in cars.

BRIEF DESCRIPTION OF DRAWING

FIG. 1 is a vertical section of one embodiment of a pressure sensor unit according to the present invention.

Therein, the numerals 1 to 8 denote the following pressure sensor members respectively, and the numeral 9 denotes a pressure sensor unit;

1: housing
2: adhesive
3: mount
4: sensor chip
5: terminal
6: bonding wire
7: fluorinated polymer-containing adhesive film
8: fluorinated polymer-containing gel encapsulant

DETAILED DESCRIPTION OF THE INVENTION

The invention is illustrated more specifically using the drawing inserted herein as FIG. 1.

FIG. 1 shows a vertical section of an example of the present pressure sensor unit. Therein, the numeral 1 denotes a housing, the numeral 2 an adhesive; the numeral 3 a mount, the numeral 4 a sensor chip, the numeral 5 a terminal connected to an external electrode, the numeral 6 a bonding wire connecting the sensor chip 4 to one of the terminals 5, the numeral 7 a fluorinated polymer-containing adhesive film, and the numeral 8 a fluorinated polymer-containing gel encapsulant.

More specifically, the housing 1 is made from a resin, such as poly(phenylene sulfide) resin (generally abbreviated as "PPS"), and has an open top. At the central part of the housing 1 is disposed a sensor chip 4 which is firmly bonded to a mount 3 made of, e.g., glass. The internal pressure of the housing 1 is detected by the sensor chip 4. The mount 3 is fixed to the inner base of the housing 1 by means of an adhesive 2. As the adhesive 2, it is desirable to use a fluorinated polymer-containing adhesive, such as an adhesive of fluorosilicone or perfluoropolyether type.

Inside the housing 1, at least two terminals 5 are disposed. One end of each terminal is connected to the outside, and the other end thereof is connected to the sensor chip 4 via a bonding wire 6. The pressure signals detected by the sensor chip 4 can be taken out from each terminal 5 to the outside. The adhesive film 7 covering the upper part of the terminals 5 is similar in fluorinated polymer to the gel encapsulant 8 illustrated below, and can be formed by curing a thermally curable liquid perfluoropolyether polymer composition.

As an example of a fluorinated polymer-containing adhesive composition useable for the foregoing purpose, mention may be made of a thermally curable composition comprising (A) a fluorinated amide compound containing vinyl groups and a perfluoropolyether structure in the main chain, (B) a fluorinated polyorganohydrogensiloxane having at least two hydrosilyl groups in a molecule,(C) a catalytic amount of platinum group compound and (D) a tackifier. Such a composition can be found in U.S. Pat. No. 5,656,711 (corresponding to JP-A-9-95615).

Herein, the upper part of the terminals 5 is covered with an adhesive composition and then subjected to heating at a temperature of no higher than 200° C., preferably from 100 to 200° C., for several minutes to several hours. As a result, the adhesive composition is formed into a film adhering to the surfaces brought into contact therewith. The adhesive composition may be cured or may remain uncured before the fluorinated polymer-containing gelable composition is cast in the housing. For the purpose of raising the adhesiveness at the interface between the fluorinated polymer-containing adhesive 7 and the fluorinated polymer-containing gel encapsulant 8, it is desirable that after filling the fluorinated polymer-containing gelable composition the adhesive composition and the gelable composition be cured simultaneously.

As an example of a fluorinated polymer-containing gelable composition which can be used, mention may be made of a thermally curable composition comprising (A) a straight-chain polyfluoro compound containing at least two alkenyl groups per molecule and having a perfluoro structure comprising at least one perfluoropolyether unit in the main chain (B) a straight-chain polyfluoro compound containing one alkenyl group per molecule and having a perfluoro structure comprising at least one perfluoropolyether unit in the main chain (C) organosilicon compound containing at least two hydrosilyl groups per molecule, and (D) a platinum group metal catalyst. Such a composition can be found in U.S. Pat. No. 6,040,400 (corresponding to JP-A-11-11685).

In a case where the simultaneous curing is adopted, it is desirable for the fluorinated polymer-containing adhesive composition to contain silica. In particular, it is advantageous that the viscosity of the adhesive composition be significantly different from that of the gelable composition. In addition, it is desirable for the adhesive film to have a hardness of from 5 to 60 degrees (measured in accordance with JIS A). When the hardness of the adhesive film is lower than 5 degrees, the changes in temperature and/or pressure tend to cause the production of air bubbles on the periphery of the terminals, and further give rise to the growth of bubbles to crack the film. When the adhesive film has a hardness higher than 60 degrees, on the other hand, it tends to occur that the adhesive film cannot follow the temperature change to peel off the surfaces with which it was once in close contact.

The fluorinated polymer-containing gel encapsulant 8 for the present pressure sensor unit is prepared by curing a thermally curable liquid perfluoropolyether polymer composition. As mentioned above, the gel formed by curing a liquid perfluoropolyether resin composition is well-suited for a pressure sensor unit exposed to an acidic gas/water vapor mixture atmosphere. The gel formation is carried out by filling the housing 1 with the foregoing gelable composition so that the fluorinated polymer-containing adhesive layer 7, the sensor chip 4 and the bonding wires 6 are all buried in the gelable composition, and then heating the gelable composition to a temperature of 200° C. or below, preferably from 100° C. to 200° C., for a period of several minutes to several hours.

It is desirable for the gel formed by curing the foregoing gelable composition to have a loaded needle penetration of from 1 to 100, measured according to JIS K 2220. When the penetration of the gel is smaller than 1, the gel cannot relieve the stress caused by the temperature and/or pressure change the sensor unit has suffered; as a result, sensor characteristics are subject to fluctuation and, what is worse, breaks tend to occur in bonding wires. On the other hand, when the gel has a penetration greater than 100, the liquefaction thereof tends to occur when the gel suffers a change of pressure.

Now, the present invention is illustrated in detail by the following example of the present pressure sensor unit. However, the invention should not be construed as being limited to this example.

The entire disclosure of all applications, patens and publications, cited above and below, and of corresponding Japanese application No. Hei 11-282430, filed on Nov. 4, 1999, is hereby incorporated by reference.

EXAMPLE

A pressure sensor unit shown in FIG. 1 was produced, wherein the upper part of each terminal 5 was covered with a film of fluorinated polymer-containing adhesive having a hardness of 25 degrees (SIFEL 611, trade name, a product of Shin-Etsu Chemical Co., Ltd.) and the housing 1 was filled with a fluorinated polymer-containing gel material having a penetration of 90 (SIFEL 819A/B, trade name, a product of Shin-Etsu Chemical Co., Ltd.) in a condition that the gel material completely covered all of the adhesive film 7, the sensor chip 4 and the bonding wires 6. This pressure sensor unit was soaked in gasoline or water for a period of 1 week, and then taken out.

Each of the thus treated pressure sensor unit was tested on its endurance under a condition that it underwent the following pressure cycle and heating-cooling cycle at the same time. As a result, neither formation of bubbles nor appearance of cracks was detected in the gel sealant of each pressure sensor unit even after the those cycles were repeated 1,000,000 times, based on pressure cycle. By contrast, the pressure sensor unit sealed with the gel alone produced bubbles and had breaks in bonding wires before those cycles were repeated 30,000 times, based on pressure cycle.

Pressure cycle: 2000 mmHg/2 sec–100 mmHg/2 sec cycle

Heating-cooling cycle: 130° C./60 min–40° C./60 min cycle

What is claimed is:

1. A pressure sensor unit comprising a housing, pressure sensor members which are installed in the housing and include a mount, the bottom of which is fixed to the inner base of the housing by means of an adhesive, a sensor chip firmly bonded to the top of the mount, terminals disposed on the inner base of the housing and bonding wires connecting the sensor chip to their respective terminals, and an encapsulant filling the housing so that all the pressure sensor members are completely buried therein: said terminals being covered with a film formed from a fluorinated polymer-containing adhesive composition in at least an upper part thereof, and said encapsulant being a gel material formed from a fluorinated polymer-containing gelable composition, wherein the fluorinated polymer in the adhesive composition has the same perfluoropolyether structure as the fluorinated polymer in the gelable composition and both the compositions are thermally curable by the same cross-linking reaction.

2. A pressure sensor unit according to claim 1, wherein said adhesive composition comprises (A) straight-chain perfluoropolyether compounds containing alkenyl groups in each molecule and having a perfluoropolyether structure in each main chain, (B) fluorine-containing organic silicon compounds containing in each molecule hydrogen atoms bonded to silicon atoms, (C) a platinum group compound, (D) a tackifier, and (E) silica.

3. A pressure sensor unit according to claim 1, wherein the film formed from the fluorinated polymer-containing adhesive composition has a hardness of 5 to 60 degrees as measured in accordance with JIS A and the gel material has a loaded needle penetration of from 1 to 100 as measured in accordance with JIS K 2220.

4. A pressure sensor unit according to claim 1, wherein the fluorinated polymer-containing adhesive composition comprises: (A) a fluorinated amide compound containing vinyl groups and a perfluoropolyether structure in the main chain, (B) a fluorinated polyorganohydrogensiloxane having at least two hydrosilyl groups in a molecule, (C) a catalytic amount of platinum group compound and (D) a tackifier.

5. A pressure sensor unit according to claim 1, wherein the fluorinated polymer-containing gelable composition is a thermally curable composition comprising: (A) a straight-chain polyfluoro compound containing at least two alkenyl groups per molecule and having a perfluoro structure comprising at least one perfluoropolyether unit in the main chain (B) a straight-chain polyfluoro compound containing one alkenyl group per molecule and having a perflouro structure comprising at least one perfluoropolyether unit in the main chain (C) an organosilicon compound containing at least two hydrosilyl groups per molecule, and (D) a platinum group metal catalyst.

* * * * *